United States Patent [19]

Mayer

[11] 4,301,428
[45] Nov. 17, 1981

[54] RADIO FREQUENCY INTERFERENCE SUPPRESSOR CABLE HAVING RESISTIVE CONDUCTOR AND LOSSY MAGNETIC ABSORBING MATERIAL

[76] Inventor: Ferdy Mayer, 18 Rue Thiers, 38000 Grenoble, France

[21] Appl. No.: 79,197

[22] Filed: Sep. 26, 1979

[30] Foreign Application Priority Data

Sep. 29, 1978 [FR] France ............................. 78 27880

[51] Int. Cl.³ ...................... H01P 1/22; H01P 1/20; H01P 3/00
[52] U.S. Cl. ........................................ 333/12; 174/36; 333/236; 333/243; 333/184
[58] Field of Search ................ 333/12, 184, 236, 243; 174/36; 338/214

[56] References Cited

U.S. PATENT DOCUMENTS

| | | | |
|---|---|---|---|
| 3,191,132 | 6/1965 | Mayer | 333/184 |
| 3,683,309 | 8/1972 | Hirose | 333/12 X |
| 4,079,192 | 3/1978 | Josse | 174/36 X |
| 4,104,600 | 8/1978 | Mayer | 333/12 X |

Primary Examiner—Paul L. Gensler
Attorney, Agent, or Firm—Oblon, Fisher, Spivak, McClelland & Maier

[57] ABSTRACT

At least one conductive element combined with a magnetic absorbing mixture surrounding at least part of the conductor has a composite structure: a core is formed by a filament or fiber (rayon, nylon, glass) and a conductive coating (metal or metallic glass). There is so provided a high resistance element, with good mechanical properties and a great absorption of high frequencies.

Applications: antiparasitic cables for ignition of internal combustion engines, instrumentation and low-pass cables, coaxial cables, shields and screens.

15 Claims, 9 Drawing Figures

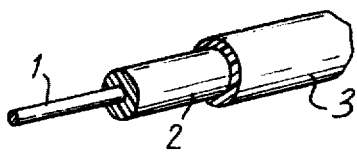
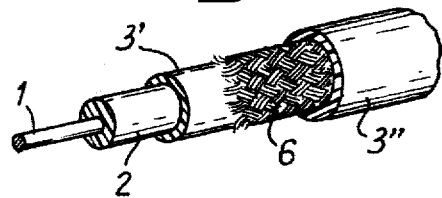
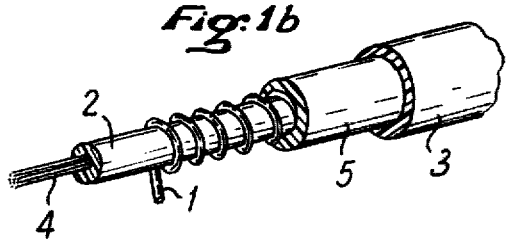
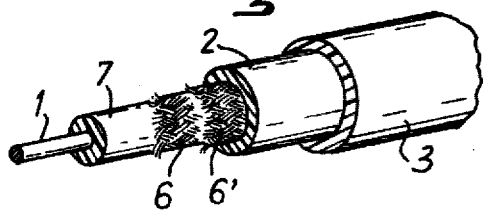
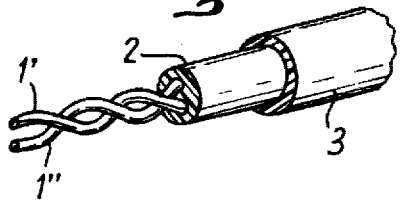
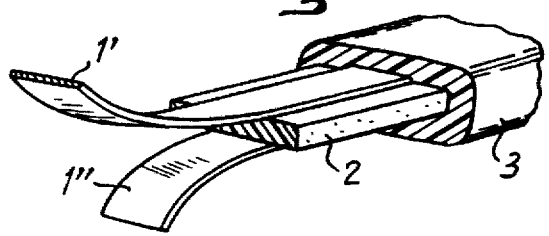
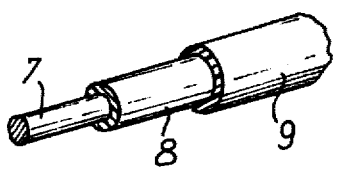
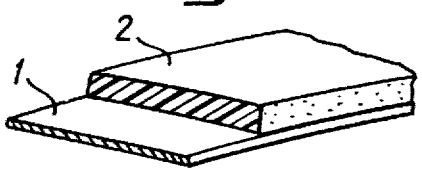
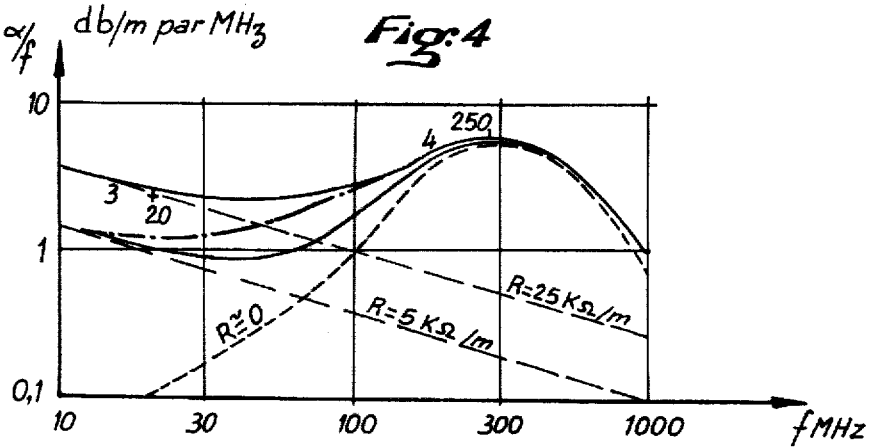

RADIO FREQUENCY INTERFERENCE SUPPRESSOR CABLE HAVING RESISTIVE CONDUCTOR AND LOSSY MAGNETIC ABSORBING MATERIAL

The invention relates to lossy electrical devices such as electrical wire, cable or screen which can be used in various fields where interference radiation should be suppressed, e.g. for the ignition of internal combustion engines, measurements in laboratories, etc.

BACKGROUND OF THE INVENTION

French Pat. No. 1,475,665 discloses a RFI suppressor cable, resisting and absorbing, making application of the absorptive principle (see French Pat. Nos. 1,205,158—74,223 and 80,097 and U.S. patent application Ser. No. 855,593 of Nov. 29, 1977 now abandoned) of the medium surrounding the conductor which conductor can be straight or helicoidal, but not metallic, formed by a base of plastic material in which the desired conductivity is obtained by a conductive charge of carbon and/or metallic powder. In this way resistance values of 500 to 3000 $\Omega$ per meter may be obtained, the action of which is to be added to the absorptive effect of the surrounding medium, in view of suppressing the conduction and radiation of RFI in the internal combustion engine ignition circuits.

This type of realization presents some drawbacks, such as the impossibility of obtaining stable values of conductor resistance (more especially with temperature) and a mechanical quality good enough for ensuring a sufficient life expectancy, due to the multiple strains of various kinds such as mechanical, thermal, etc. Moreover, these problems are presently enhanced by the evolution and development of modern techniques for engine ignition, the systematic use of radio equipment (reception and transmission onboard and the ever increasing use of electronic equipment onboard, all of which is requiring higher values of resistance. For example, 1000 to 100,000 $\Omega$/m for linear conductors are usual nowadays; 5000 $\Omega$/m are currently used in France and 15,000 $\Omega$/m are currently used in the United States.

Then, if a metallic conductor is convenient for the realization of the smaller values, the higher values show a contradictory evolution: the realization of the above cited high values of resistance with a favourable helicoidal structure (allowing the use of a great length of conductor) reaches the mechanical limit for the practical realization or even goes beyond this limit. For example, the realization of a cable of 5000 $\Omega$/m in the form of an helix of 3 mm diameter, with thirty turns per cm, with the strongest metallic alloys presently known, requires the use of a wire with a diameter comprised between 6 and 8 hundredths of a mm, which is inconsistent with the strength and reliability on the long term, in the considered use. Beside this application to ignition cables, there is evidently a number of other wires and cables for which such a structure is of advantage for the realization of a transmission absorbing interference voltages or fields.

SUMMARY OF THE INVENTION

The present invention has for its object the realization of a wire or cable which presents in combination an absorbing effect with at least one conductor, in which at least one element has a composite structure comprising a core made of a filament in plastic, textile or amorphous, non conductive material, such as rayon, nylon, glass fiber or the like, coated with a thin metallic or metal-like layer (the thickness being comprised between 0.05 and 10$\mu$ for example), forming a part of the whole section of the composite conductor, allowing the realization of a strong mechanical structure, for the further steps of manufacture as well as for the later action of the environment, showing an electrical behaviour identical to that of compact metal for the specific conductivity as well as for the electrical connection with other interfaces.

The invention has also for its object to use such filaments in the form of an assembly (conductor in the form of a simple strand, multiple strand, braid, etc) having optimum mechanical characteristics, for having a final section (in a coiled or lapped structure) of optimum shape, regarding certain useful electrical characteristics such as the reduction of electrical strains due to the high voltage applied, in connection with the covering factor in the case of a shielded braid or for having an anisotropic conductivity in the case of such juxtaposed assemblies.

The invention has also for its object to use such metal coated filaments in the form of an assembly of a number of monofilaments chosen for obtaining the desired value of linear electrical resistance; this resistance value being beyond the range of resistant metallic wire which can be used in practice.

It is another object of the present invention to provide ignition cables which present a general metallic-type of conduction and good metal-metal contacts with the connectors, in spite of high resistance values.

It is another object of the present invention to provide a wire or cable with a metallic conductor, the skin effect of which is practically non existent for the useful frequency range (non magnetic conductive metals and alloys), or existent (magnetic metals and alloys) providing advantages in the interference- or RFI-suppressor behaviour of the cable. More specifically, the use of these latter allow a specific selective absorption (due to the wire magnetic losses), independently from and additional to the losses of the surrounding medium.

It is still another object of the present invention to provide an optimization of the choice of the linear resistance so that the sum of the corresponding absorption (resistive alone or resistive and magnetic) with the absorption of the surrounding medium, provides the interference-suppressor action required, for the intensity as well as for the frequency, in the usual range of action of the cable (10 to 1000 MHz for example).

It is another object of the present invention to provide a cable with a conductor of which the resistivity is sensitive to temperature, such as for example pure iron or some Fe, Ni, Cr, etc alloys. As a matter of fact, for example, an increase of the cable resistance with temperature can be used for a distributed realization of the ignition optimization effect, as described in the French Patent application No. 77 01500.

It is another object of the present invention to associate the various embodiments of the invention with an optimum shunt capacity in the four-pole structures, more especially for the realization of cables, i.e. operating as a distributed low-pass filter.

It is another object of the present invention to use the association of a flexible absorbing layer on a bidimensional structure of woven composite thread, for the realization of electromagnetic HF em shields and screens.

Various other objects, features and attendant advantages of the present invention will be more fully appreciated as the same becomes better understood from the following detailed description of the present invention when considered in connection with the accompanying drawings.

BRIEF DESCRIPTION OF THE DRAWINGS

FIGS. 1a to 2d are perspective views representing some conventional configurations which may be used for wires and cables according to the invention.

FIG. 3 is a perspective view of a cable according to the invention.

FIG. 4 is a diagram representing for several cables, conventional and according to the invention, the relative attenuation a/f in decibels/meter, referred to one megaHertz (1 MHz).

The cable of FIG. 1a comprises a conductor 1, made of a resistive wire, or of a magnetic wire of low conductivity (plain wire or a braid) an absorbing sheath 2, made of lossy magnetic material, and an insulating cover 3 made of plastic, polymer, fiberglass, rubber and/or textile.

FIG. 1b represents a cable with a conductor 1, helically wound around an absorptive core 2. A thread 4 of textile or synthetical fibers helps extruding the core 2. A second absorbing layer 5 may be present or not and finally the outer insulating layer 3 protects this helicoidal structure.

FIG. 1c shows a half closed structure with a pair of conductors 1' and 1" twisted or not, surrounded by the absorbing medium 2 and covered by the insulating layer 3.

FIG. 2a shows an absorbing coaxial cable in which the central conductor 1 is surrounded by the lossy medium 2. One thin insulating layer 3' may be present or not, and disposed outside (or inside) the absorbing sheath; its purpose is to provide the cable with dielectric rigidity. The absorbing medium is a bad insulator and has a bad dielectric strength, due to its composite structure. The return conductor of FIG. 2a is formed by a metallic braid, a metallic or metal coated lapped tape 6 forming the ground electrode. The cover 3" forms an insulating protection (or conductive). Several central conductors could form in the same way a multiple coaxial cable. The conductors are of the same type as above described.

FIG. 2b shows a typical structure of common mode suppressor and anti cross-talk cable, where 1 is a good conductor, 7 a good dielectric and 6 the ground electrode. Such an assembly forms a conventional coaxial cable, with low losses. An outer layer 2 of absorbing material suppresses the parasitic currents on the braid 6 surface, such braid 6 forming ground or mass, its both ends being connected to ground. A braid 6' of resistive conductors is disposed between braid 6 and layer 2.

If now, in such an assembly, a supplementary ground screen is disposed outside of the absorbing layer 2, it is so provided a cable with low transfer impedance, with suppression of the inner resonances due to the absorption.

FIG. 2c shows an example of an absorbing "flat-twin" line, embodying the same principles, and where 1' and 1" are resistive conductors.

FIG. 2d shows a flat conductor 1, made of resistive conductors braided to form a band, ribbon, etc. in view of providing flexibility. Conductor 1 is coated on one face, or both, with a layer of absorbing mixture.

One or more conductors in each one of these structures may be formed by a composite conductor, manufactured in the following way (FIG. 3): one sole fiber of filament 7 of polymeric, plastic, textile or glass type, more generally any thin flexible filament being of a diameter comprised between about 1 and $100\mu$, is coated at least on a part of its surface with a metallic or metal-like layer 8, formed by any known way such as by chemical deposit, gaseous or liquid phase techniques, evaporation, etc . The thickness of the layer is less than the fiber diameter, and is so comprised between about 0.02 and $20\mu$, according to the fiber diameter. Such metallized fibers are nowadays commercially available, more particularly for the manufacture of electrostatic protection cloth, shield cloth for electromagnetic fields and heating cloth, heating carpet, e.g. against frost, etc.

For example, there is commercially available from the firm ROHM & HAAS such a product called X-Static which is a textured, fine nylon yarn with a coating of metallic silver. Each filament has a denier of 3.8, that is $24\mu$ in thickness, including a $3\mu$ thick coating of silver, 13 g breaking strain, and an electrical resistance of about 10 k$\Omega$ per meter. X-Static is supplied as a 27 deniers, 7 filaments multifilament yarns and as many as necessary of 7 filaments yarns are assembled so as to produce the necessary resistance values. Other similar products are likewise available and it is possible to those ordinary skilled in the art to manufacture other composite conductors with other filaments and metal according to the teachings of the present invention.

Conductor 7 may be of any section different from a circle, and may be oval or flat or any other form, without departing from the scope of the present invention.

An outer insulating layer 9 can be provided in some cases. The structure of layer 8 can be of various types: several examples will be given hereinafter. But, essentially, this layer is formed by a continuous uninterrupted metallic layer excluding any composite structure with carbon, graphite or metallic particles.

Such fibers with a reduced section can be assembled to form a "conductive thread"; practically 5 to 50 such metal coated fibers are united according to known techniques (stranded), by simple twisting or by "Litz" type twisting in the same manner as textiles threads. Such strands can in the same way be assembled to form clothes, braids, sheaths, etc.

The invention will be more fully understood by reference to the following description of a first example in an application to the antiparasitic cables for car internal combustion engine ignition. The most usual design is that shown on FIG. 1b: a strand such as just described is wound around a flexible absorbing core of the type described in the above cited French Patents. The spacing and diameter of this winding determine the magnetic absorption due to the absorbing core: this magnetic absorption determines the antiparasitic performances of the cables for high frequencies (e.g. above 100 MHz); the required resistance is provided by choosing a convenient composite strand, taking in account the spacing and diameter of the coil; the resistance value will determine the antiparasitic performances of the cables for low frequencies (e.g. between 20 and 100 MHz).

On FIG. 4 are shown some typical results in attenuation (in ordinate, the attenuation in decibels per meter, per MHz) obtained by the two effects (for two respective resistance values, but for one diameter —3 mm- and one constant spacing —30 turns/cm-). The attenuation is measured in equivalent coaxial line and are true images of the actual attenuation on cars, as much in conductivity as wave radiation. The addition of the two effects allows to obtain an optimized attenuation curve, as much in value as in selectivity. The two sloping straight lines show the attenuations obtained by resistive conductors (25 kΩ/m for the upper line and 5 kΩ/m for the lower line) wound on a non absorbing insulating core. The dashed curve relates to a non resistive conductor (e.g. copper) wound around the absorbing mixture. There is no attenuation for the low frequencies. The other two full line curves correspond to resistive conductors (25 and 5 kΩ/m respectively) wound around an absorbing core.

It is evident that the effect of a resistive conductor increases for the low frequencies, which for the radio frequencies provides a substantial anti-parasitic action, in connection with a weakening of the ignition spark.

The practical values of resistance in the above cited range of 2500 to 25,000 Ω/m are easy to obtain, in the range of diameters (1 to 5 mm) and of the winding pitch (50 turns/cm to 0=straight wire) currently used for such antiparasitic cables. As a matter of fact, it is possible to modify the number of filaments and the thickness of the metallic conductive layer. According to the invention, a rather great number of fibers is used so as to ensure a high reliability. For example, with a strand of 36 fibers, it is possible to have values of 105 Ω/m to 150 kΩ/m (straight conductor).

According to the invention, conventional pressure contacts on such a strand by means of crimp, set eye terminals, studs, etc, such as currently used in the car industry, ensure reliable metal to metal contact with terminal at the end of such antiparasitic conductors.

The fibers, and consequently the strands and the assemblies made with them have essentially the mechanical features of the support fiber: very good mechanical performance in traction, etc are obtainable (e.g. with nylon) overcoming by far the performances of the strongest metals or metallic alloys. The high resilience of the fibers provides other important features according to the invention.

So, for example, a strand wound under traction around an absorbing core, will be more or less flattened with spreading out of the fibers and the section of the composite conductor is rather a flattened oval than a circle. This effect is depending on the realization of the strand (more or less strongly twisted) and on the assembly of several strands forming the conductor (braid).

According to the invention, a certain spreading out of the conductor, without the adjacent turns being in contact, is favourable for the dielectric rigidity of the ignition cable, i.e. the core lapped with the conductors and surrounded by a layer of flexible insulating material.

According to another feature of the invention, a spreading out of the turns of the winding, wherein each turn is slightly in contact with the two adjacent turns allows to provide an additional absorbing effect. (Skin effect described in French Pat. Nos. 1,428,517, 1,514,178 and 1,568,739) due to the "axial" conductivity of an helicoidal structure.

According to the invention, this spreading out of each strand for a flat or tubular braid (example of a coaxial shielded cable, described hereinafter) allows to provide an improved overlapping ratio, almost 100%, effect which is particular to the use of multiple fibers, very resilient. Besides, this effect is well known in the textile manufacturing technologies (waterproof clothes).

The composition of the conductive metallic layer on the fiber will be chosen by taking in account the necessary values of resistance, the turns spacing and the core diameter in the case of the helicoidal conductor.

Such deposits of pure metal (silver, copper, iron, nickel, etc) are directly available in the trade. The deposit of alloys is also possible.

According to the invention, these deposits are characterized by a pure metallic conduction with essentially the corresponding features, particularly the conductivity; there is so provided stable resistance values with low temperature coefficient, peculiar to metals.

According to the invention, the wires and cables manufactured with non magnetic metals and alloys are characterized by a skin thickness in the range of 4 to 40μ (for 100 MHz for example); compared with the above cited layer thickness, they present a resistance which varies a little or not in the interesting field: this is when the fixed resistances of FIG. 4 can be used (5 kΩ/m and 25 kΩ/m curves).

According to the invention, layers of magnetic metals (iron, nickel, etc) or alloys (Fe, Ni, Co, etc) are particularly interesting since their skin thickness can be 10 to 100 times less (for a convenient choice of the parameters of the deposit layers on the fibers, a choice of material and of resistivity, etc). According to the invention, in the same category, one can use non metallic magnetic conductive materials such as for example amorphous glasses, using transition elements (Fe, Ni, Co) alloyed with glass formers such as B, P, Al, Si, etc, with additives to impart specific properties (Cr, Mo, etc) produced by rapid quenching from the liquid phase. Such materials are available on the market, as for example METGLAS, from Allied Chemical Co; they combine outstanding magnetic performance, high resistivity and -contrary to pure high permeability metallic alloys- are insensitive to mechanical stress, i.e. the coiling of the final cable does not degrade performance.

For such magnetic conduction materials, the high frequency resistance increases then proportionally to the frequency, and it is for example possible to multiply by 3 the resistance between 20 and 60 MHz. In the practical example of FIG. 4, the attenuation so passes from the curve 5 kΩ/m to the curve 25 kΩ/m and the attenuation is then presented by the chain-dotted line curve, which is particularly favourable in the range of 30 to 100 MHz.

To this skin effect is added a favourable effect of "internal" inductance and magnetic losses due to the conductor, and described in the cited references.

According to the invention, such deposits of metallic layers may on the contrary present a high temperature coefficient, but well-known and stable, such as that obtained for example with pure iron and certain resistive alloys (Fe, Ni, Cr, etc) used in the heating industry; this effect can be made optimum with certain compounded oxides, used in the techniques of thin layers in electronics, and in the manufacture of PTC resistances. An increase of the ignition cable resistance, when the car motor temperature increases, allows to introduce the effect of ignition optimization described in the French Pat. No. 77 01500 because at the starting a stronger spark is used, useful to the cold motor running and a weaker spark when the motor is hot, increasing the plug life and reducing the RFI.

As a second example, reference is made to another antiparasitic ignition cable, in which the conductor is straight, as shown in FIG. 1a: a more resistive conductor will then be used so as to obtain the desired resistance value per meter. The magnetic absorbing effect will be lower, but can nevertheless be used, more particularly if a magnetic conductor is used, as described above.

As a third example, reference is made to a cable such as shown in FIG. 1c or on FIG. 2a according to which the conductors are resistive. Such cables are useful in instrumentation, such as for example nanosound oscilloscopy and in probes for the anaylsis of high frequency electric and magnetic fields, where it is required that the cables do not disturb said fields.

As a fourth example, reference is made to a conventional coaxial structure, such as shown on FIG. 2b in which the braid 6 is made by a good conductor and the absorbing layer replaced partially or totally by the resistive conductor 6' (braided or simply wound). In such a structure, this resistive conductor is working both for suppressing the common mode voltages (crosstalk) and for the shielding effectiveness at high frequencies (for example above several MHz) due to the described spreading out effect.

Such cables are useful in telecommunication, computing techniques, military applications and generally in the techniques where strong outside disturbances (parasitic inductions due to normal or exceptional environment) risk to be introduced in the cable and to be superposed to the useful signal. More particularly, the multiple screen cables providing a strong protection against these interferences, in superposing several conductive and magnetic screens can be realized in this way, using the possibilities of the invention of manufacturing conductors (particularly shields) of controlled resistivity and permeability and a screen with an effective overlapping of 100% coverage (due to the described spread out effect), i.e. presenting no leakage at very high frequencies.

As a fifth example, a typical structure with a very low transfer impedance at high frequencies comprises according to the invention, the structure shown on FIG. 2b with an additional layer (disposed between the absorbing magnetic layer 2 and the outer insulation 3) of resistive conductors, in form of a tightened braid or lapping. A superposed supplementary absorbing magnetic layer provides an additional improvement in the parasitic suppression of common mode.

Finally, all the conventional techniques providing maximum shunt effect (capacity between conductors or between conductor and ground) fall within the scope of the invention; more particularly in the realization of low-pass structures such as described in the above cited patents and in the French Pat. Nos. 75 15745, 75 30476, 1,479,228, 1,490,488, 2,098,975 and 2,249,489.

What I claim is:

1. An electric lossy element of the electric wire, cable or screen type, comprising:
   at least one conductive element, said conductive element being a composite structure including a non-conductive core of the textile, plastic or glass type coated with a thin conductive metallic layer; and
   a magnetic absorbing mixture at least partially surrounding said at least one conductive element, said magnetic absorbing mixture being non-conductive.

2. Electric element according to claim 1, wherein the conductive coating is formed by chemical deposit.

3. An electric element according to claim 1, wherein the conductive coating is formed by gaseous phase techniques.

4. An electric element according to claim 1, wherein the conductive coating is formed by liquid phase techniques.

5. An electric element according to claim 1, wherein said conductive element comprises an assembly of filaments forming a cable.

6. An electric element according to claim 1, wherein said conductive element comprises an assembly of filaments forming a braid.

7. An electric element according to claim 1, wherein said conductive element comprises an assembly of filaments forming a tape.

8. Electric element according to claim 1, wherein the core of the conductive element is formed by a filament or fiber the diameter of which is comprised between about 1 and 100$\mu$, the conductive coating having a reduced thickness regarding to the diameter, the conductive coating thickness being comprised between about 0.02 and 20$\mu$.

9. Electric element according to claim 8 wherein the conductive coating is formed by a non magnetic metal or alloy, providing a resistance practically equal to the resistance for a direct current.

10. Electric element according to claim 8, wherein the conductive coating is formed by a magnetic metal having a skin thickness less than that of a non-magnetic conductive layer, providing a selective resistance in the range of frequencies.

11. Electric element according to claim 2, wherein the conductive coating has a resistance sensitive to temperature.

12. Electric element according to claim 1 characterized in that said conductive element comprises an assembly of filaments forming a strand.

13. Electric element according to claim 12, wherein the assembly of filaments is of a round cross section.

14. An electric element according to claim 12, wherein the assembly of filaments is of a flattened cross section.

15. A radio frequency interference suppressor cable, comprising:
   at least one conductive element; and
   a magnetic absorbing mixture, said mixture at least partially surrounding said at least one conductive element;
   wherein said at least one conductive element includes a plurality of non-conductive fibers, each of said plurality of fibers being coated with a thin conductive metallic layer, said plurality of fibers being grouped together.

* * * * *